(12) United States Patent
Scheen et al.

(10) Patent No.: US 11,538,689 B2
(45) Date of Patent: Dec. 27, 2022

(54) METHOD OF ELECTROCHEMICALLY PROCESSING A SUBSTRATE AND INTEGRATED CIRCUIT DEVICE

(71) Applicant: UNIVERSITE CATHOLIQUE DE LOUVAIN, Louvain-la-Neuve (BE)

(72) Inventors: Gilles Scheen, Louvain-la-Neuve (BE); Jean-Pierre Raskin, Louvain-la-Neuve (BE); Jonathan Rasson, Louvain-la-Neuve (BE)

(73) Assignee: UNIVERSITE CATHOLIQUE DE LOUVAIN, Louvain-la-Neuve (BE)

( * ) Notice: Subject to any disclaimer, the term of this patent is extended or adjusted under 35 U.S.C. 154(b) by 142 days.

(21) Appl. No.: 16/980,117

(22) PCT Filed: Mar. 22, 2019

(86) PCT No.: PCT/EP2019/057305
§ 371 (c)(1),
(2) Date: Sep. 11, 2020

(87) PCT Pub. No.: WO2019/180237
PCT Pub. Date: Sep. 26, 2019

(65) Prior Publication Data
US 2020/0411324 A1 Dec. 31, 2020

(30) Foreign Application Priority Data
Mar. 23, 2018 (BE) .................................. 2018/0034

(51) Int. Cl.
*H01L 21/3063* (2006.01)
*H01L 23/12* (2006.01)
(Continued)

(52) U.S. Cl.
CPC ...... *H01L 21/3063* (2013.01); *H01L 21/0203* (2013.01); *H01L 21/02016* (2013.01); *H01L 21/479* (2013.01); *H01L 23/13* (2013.01)

(58) Field of Classification Search
CPC ... H01L 21/3063; H01L 23/13; H01L 23/326; H01L 21/479; H01L 21/0203; H01L 21/02016
See application file for complete search history.

(56) References Cited

U.S. PATENT DOCUMENTS 6,287,936 B1    9/2001 Perea et al.
8,829,332 B1 *  9/2014 Roizin ............... H01L 31/0475
                                                        257/290
(Continued)

FOREIGN PATENT DOCUMENTS

EP    0041101 A1    12/1981
EP    0226091 A2     6/1987

OTHER PUBLICATIONS

International Search Report and Written Opinion dated Jun. 18, 2019, for International Patent Application No. PCT/EP2019/057305.

*Primary Examiner* — David Vu
*Assistant Examiner* — Brandon C Fox
(74) *Attorney, Agent, or Firm* — Karceski IP Law, PLLC

(57) ABSTRACT

A substrate has a front side including an electrical circuit and a rear side including an exposed zone that faces the electrical circuit. In an electrochemical treatment step, an electrical potential is laterally applied at least to the exposed zone of the rear side of the substrate, while the exposed zone is in contact with a chemically reactive substance. The electrical potential causes a lateral flow of electrical current at least in (Continued)

the exposed zone of the substrate. The lateral flow of current and the chemically reactive substance alter the substrate in at least the exposed zone.

15 Claims, 10 Drawing Sheets

(51) Int. Cl.
*H01L 23/13* (2006.01)
*H01L 21/02* (2006.01)
*H01L 21/479* (2006.01)

(56) References Cited

U.S. PATENT DOCUMENTS

| | | | |
|---|---|---|---|
| 8,920,625 B2* | 12/2014 | Ferrari | A61K 9/141 |
| | | | 216/101 |
| 2003/0082883 A1 | 5/2003 | Welser | |
| 2006/0110926 A1 | 5/2006 | Hu et al. | |
| 2009/0101509 A1* | 4/2009 | Honda | G02B 3/0031 |
| | | | 205/640 |
| 2009/0255820 A1* | 10/2009 | Buttard | B81C 1/00126 |
| | | | 205/640 |
| 2010/0187126 A1* | 7/2010 | Sendelbach | C25F 3/14 |
| | | | 204/224 R |
| 2012/0115311 A1 | 5/2012 | Desplobain et al. | |
| 2014/0036412 A1* | 2/2014 | Hannah | H01G 11/24 |
| | | | 216/6 |
| 2016/0079183 A1* | 3/2016 | Santos Rodriguez | H01L 29/36 |
| | | | 438/5 |
| 2017/0062284 A1* | 3/2017 | Mason | H01L 21/7624 |

* cited by examiner

METHOD OF ELECTROCHEMICALLY PROCESSING A SUBSTRATE AND INTEGRATED CIRCUIT DEVICE

CROSS-REFERENCE TO RELATED APPLICATIONS

This is a National Stage Entry into the United States Patent and Trademark Office from International Patent Application No. PCT/EP2019/057305, having an international filing date of Mar. 22, 2019, which claims priority to Belgium Patent Application No. BE2018/0034, filed on Mar. 23, 2018, the entire contents of both of which are incorporated herein by reference.

FIELD OF THE INVENTION

An aspect of the invention relates to a method of processing a substrate comprising an electrical circuit. The method may be used, for example, in manufacturing integrated circuit devices that include a semiconductor substrate. The method may particularly be used in manufacturing integrated circuit devices that, at least partially, operate at a relatively high frequency where an ordinary semiconductor substrate constitutes a lossy medium. Another aspect of the invention relates to an integrated circuit device that includes a substrate comprising an electrical circuit.

BACKGROUND ART

U.S. Pat. No. 6,287,936 describes a method of forming porous silicon in a silicon substrate, in particular for improving the quality factor of an inductive circuit produced on a silicon semiconductor wafer, which also incorporates integrated transistors. The rear face of the wafer, already incorporating the transistors and the inductive circuit on its front face, is placed in contact with an acid electrolyte containing hydrofluoric acid and at least one other acid. An anodic oxidation of the silicon of the wafer at the rear face is carried out so as to convert this silicon into porous silicon over a predetermined height from the rear face which is in contact with the electrolyte.

In the method, the wafer is sandwiched between a metal plate, which is in contact with the front face of the wafer, and a peripheral seal. The metal plate provides an anode. This anode has to be in electrical contact with the underlying silicon substrate. Such a metal contact can be made by using substrate contact pads, which exist in all the integrated circuits produced and which connect the underlying silicon substrate to the surface of the integrated circuit. All the substrate contacts may be short circuited by using a metal layer of silver paste, which can then be easily removed by dissolving in an organic solvent once the anodic oxidation is completed.

SUMMARY OF THE INVENTION

There is a need for a solution that allows broader application of altering, by electrochemical treatment, a substrate comprising an electrical circuit, In accordance with an aspect of the invention as defined in claim 1, a method of processing a substrate is provided. The substrate has a front side comprising an electrical circuit and a rear side comprising an exposed zone that faces the electrical circuit. In an electrochemical treatment step, an electrical potential is laterally applied at least to the exposed zone of the rear side of the substrate, while the exposed zone is in contact with a chemically reactive substance. The electrical potential causes a lateral flow of electrical current at least in the exposed zone of the substrate. The lateral flow of current and the chemically reactive substance alter the substrate in at least the exposed zone.

Thus, unlike the background art, in the method defined hereinbefore, an electrical potential is laterally applied to the rear side of the substrate, rather than transversally applied between the front side and the rear side. Consequently, in the method, there will be a lateral flow of current through the substrate rather than a transversal flow of current as in the background art.

The inventors of the present invention have found that although the electrical current flows laterally, rather than transversally, this does not preclude achieving an alteration of the substrate in a targeted volume. The targeted volume may extend inwardly from the rear side into the substrate, sufficiently deep, for example, to closely reach the electrical circuit. The alteration may comprise formation of pores, as in the background art, which may reduce losses induced by the substrate, at least locally, in the vicinity of the electrical circuit.

What is more, in the method defined hereinbefore, there is no need to provide for electrical contact between the front side and the rear side of the substrate, which is required in the background art for achieving an alteration of the substrate by electrochemical treatment. In general, unlike the background art, the method defined hereinbefore does not necessarily impose design constraints, such as providing for electrical contact between the front side and the rear side of the substrate.

In principle, there are no specific features that the substrate needs to have in order to alter the substrate, at least partially, by electrochemical treatment in accordance with the method defined hereinbefore. In fact, the method defined hereinbefore may, in principle, be applied to any substrate that comprises an electrical circuit on its front side. The invention thus allows broader application of altering, by electrochemical treatment, a substrate comprising an electrical circuit.

In accordance with a further aspect of the invention, an integrated circuit device is provided as defined in claim 14. The integrated circuit device includes a substrate having a front side comprising an electrical circuit and a rear side in which a zone faces the electrical circuit. The substrate has been altered by applying a method as defined hereinbefore at least in a volume comprised between the electrical circuit and the zone in the rear side that faces the electrical circuit In accordance with another aspect of the invention, a substrate comprises an alteration stop layer at least disposed between an electrical circuit comprised in a front side of the substrate and an exposed zone on a rear side. The alteration stop layer comprises a material that is relatively resistant to a chemically reactive substance used for altering the substrate. Polycrystalline silicon, for example, is particularly suited.

For the purpose of illustration, some embodiments of the invention are described in detail with reference to accompanying drawings. This description will present features additional to those mentioned hereinbefore, as well as advantages which these additional features can provide.

DESCRIPTION OF SOME EMBODIMENTS

Figure 1:
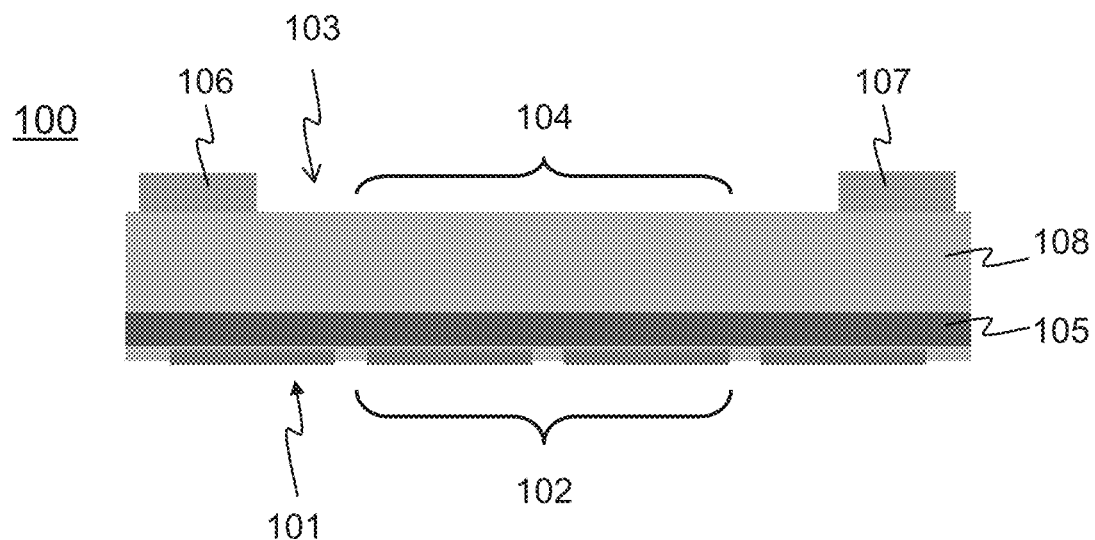
FIG. 1 is a schematic cross-sectional view of a substrate to be processed.

FIG. 1 schematically illustrates a substrate 100 to be processed. FIG. 1 provides a schematic cross-sectional view of the substrate 100 to be processed. The substrate 100 has a front side 101 that comprises an electrical circuit 102. A rear side 103 of the substrate 100 comprises an exposed zone 104 that faces the electrical circuit 102.

The substrate 100 may essentially comprise semiconductor material, such as, for example, silicon, germanium, gallium arsenide, or any other type of material or composition in which electrical circuits may be formed. The substrate 100 may be in the form of, for example, a wafer comprising a plurality of similar electrical circuits. In this respect, it should be emphasized that the drawings are very schematic for the sake of simplicity.

The electrical circuit 102 comprised in the substrate 100 may be adapted to operate at a relatively high frequency where an ordinary semiconductor substrate constitutes a lossy medium. For example, an ordinary semiconductor substrate 100 may constitute a lossy medium at a frequency higher than 100 MHz.

In this embodiment, the substrate 100 comprises an electrically insulating layer 105 disposed between the electrical circuit 102, which is comprised in the front side 101, and the rear side 103. The substrate 100 is thus of the silicon-on-insulator (SoI) type in this embodiment. The electrically insulating layer 105 may comprise, for example, silicon oxide.

In this embodiment, the substrate 100 comprises two electrodes 106, 107 disposed on the rear side 103 of the substrate 100. One of the two electrodes 106 is located near an edge of the substrate 100; the other electrode 107 is located near an opposite edge. It should be noted that the two electrodes 106, 107 may, in fact, form two segments of a single circular electrode in a periphery of the substrate 100. The two electrodes 106, 107 provide electrical contact with a bulk section 108 of the substrate 100 that extends inwardly from the rear side 103 to the electrically insulating layer 105. The bulk section 108 of the substrate 100 may be P-doped.

Figure 2:
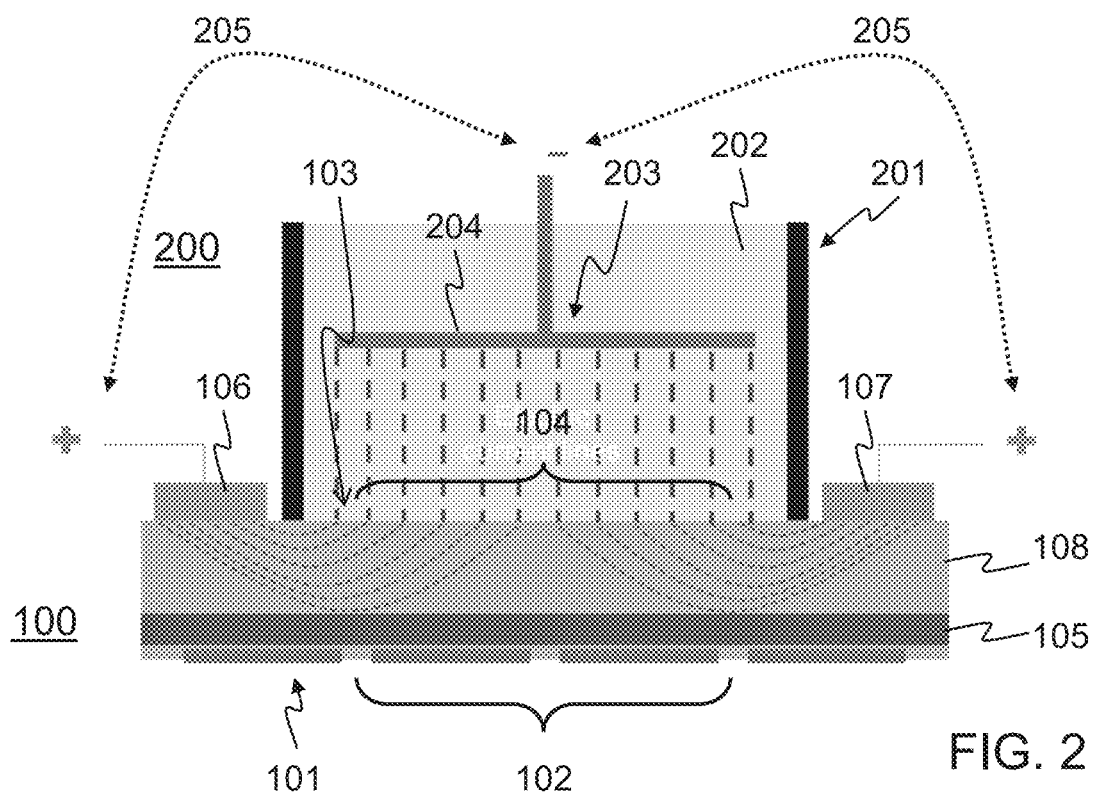
FIG. 2 is a schematic cross-sectional view of the substrate coupled to an electrochemical treatment device in an initial stage of a first exemplary method of processing the substrate.
Figure 3:
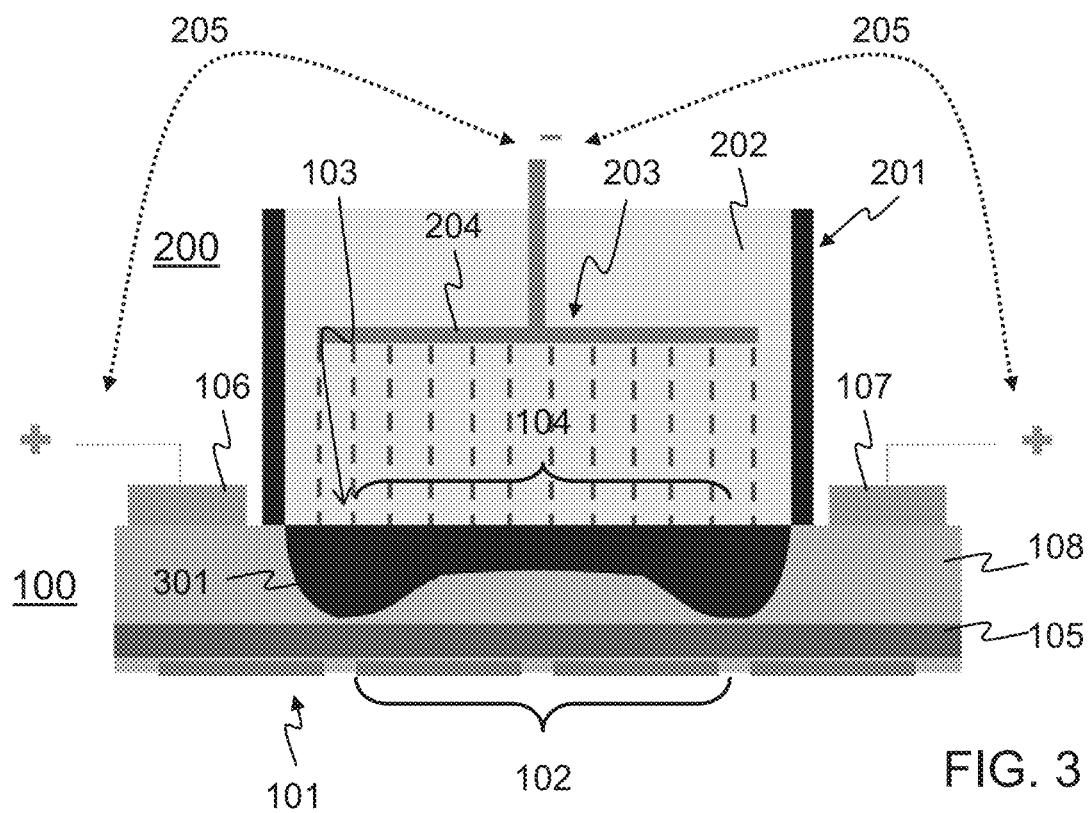
FIG. 3 is a schematic cross-sectional view of the substrate coupled to the electrochemical treatment device in an intermediate stage of the first exemplary method of processing the substrate.

FIGS. 2 and 3 schematically illustrate a first exemplary method of processing the substrate 100 described hereinbefore with reference to FIG. 1. FIG. 2 provides a schematic cross-sectional view of the substrate 100 coupled to an electrochemical treatment device 200 in an initial stage of the first exemplary method. FIG. 3 provides a schematic cross-sectional view of the substrate 100 coupled to the electrochemical treatment device 200 in an intermediate stage of the first exemplary method.

The electrochemical treatment device 200 comprises a container 201 that contains a chemically reactive substance 202. The chemically reactive substance 202 may comprise, for example, hydrofluoric acid. The container 201 has a size that allows the container 201 to be placed between the two electrodes 106, 107 on the rear side 103 of the substrate 100. The container 201 has been coupled to the substrate 100 so that the chemically reactive substance 202 is in contact with the exposed zone 104 on the rear side 103 of the substrate 100.

The electrochemical treatment device 200 further comprises an electrode arrangement 203 within the chemically reactive substance 202. The electrode arrangement 203 faces the exposed zone 104 on the rear side 103 of the substrate 100. In the first exemplary method, the electrode arrangement 203 comprises a plate-like electrode 204 that is substantially flat. The plate-like electrode 204 substantially covers the entire exposed zone 104 on the rear side 103 of the substrate 100. The plate-like electrode 204 is substantially parallel to the exposed zone 104. The plate-like electrode 204 may be in the form of, for example, an electrically conducting grid.

In the first exemplary method, an electrical potential is laterally applied to the exposed zone 104 on the rear side 103 of the substrate 100, while the exposed zone 104 is in contact with the chemically reactive substance 202 in the electrochemical treatment device 200. The electrical potential is laterally applied by applying a voltage 205 between, on the one hand, the plate-like electrode 204 within the chemically reactive substance 202 and, on the other hand, the two electrodes 106, 107 disposed on the rear side 103 of the substrate 100. The plate-like electrode 204 within the chemically reactive substance 202 constitutes a cathode, whereas the two electrodes 106, 107 disposed on the rear side 103 of the substrate 100 constitute an anode.

The electrical potential that is applied causes a lateral flow of electrical current in the exposed zone 104, The lateral flow of current and the chemically reactive substance 202 alter the substrate 100 in at least the exposed zone 104. In this embodiment, this alteration comprises formation of pores in the substrate 100.

The plate-like electrode 204 causes the electrical potential to be applied to the exposed zone 104 in a substantially homogeneous fashion. The electrical potential is substantially homogeneous over the exposed zone 104 of the substrate 100. As a result, the lateral flow of electrical current has a higher density in a peripheral area of the exposed zone 104, which is relatively close to the two electrodes 106, 107, than in a central area, which is more distant from the two electrodes 106, 107. As a result, starting from the initial stage illustrated in FIG. 2, pores will be formed inwardly from the peripheral area at a faster rate than the in the central area of the exposed zone 104.

In FIG. 3, a dark area indicates a volume 301 in the substrate 100 where pore have been formed thus far in the intermediate stage of the first exemplary method of processing. The volume 301 where pores have been formed has a lower effective dielectric constant and a lower effective electrical conductivity, which means a higher effective electrical resistivity, compared with a remaining volume of the substrate 100 where no pores have been formed. In effect, pores make the substrate 100 less lossy in the volume 301 where these have been formed.

FIG. 3 illustrates that, in the intermediate stage, the volume 301 with pores has a greater depth in the peripheral area than in the central area of the exposed zone 104 of the substrate 100. This is because the lateral flow of electrical current has a higher density in the peripheral area of the exposed zone 104 than in the central area, as explained hereinbefore, In the intermediate stage illustrated in FIG. 3, the depth of the volume 301 with pores has nearly reached the electrically insulating layer 105 in the peripheral area of the exposed zone 104. At a somewhat later stage, the volume 301 with pores will reach the electrically insulating layer 105 in the peripheral area. At that stage, the lateral flow of electrical current through the substrate 100 will essentially stop. No electrical current can flow any more between the electrode arrangement 203 in the chemically reactive substance 202 and the two electrodes 106, 107 on the rear side 103 of the substrate 100. As a result, pore formation will essentially stop.

In a final stage of the first exemplary method, a non-porous section may thus remain in the central area of the exposed zone 104, close to the electrical circuit 102. However, ideally, no non-porous section of the substrate 100 should remain in the vicinity of the electrical circuit 102. A remaining non-porous section constitutes a relatively lossy medium for the electrical circuit 102. The volume 301 with pores, represented as the dark area in FIG. 3, should thus ideally extend right up to the electrically insulating layer 105 in the substrate 100. That is, pore formation should continue right up to the electrically insulating layer 105.

Figure 4:
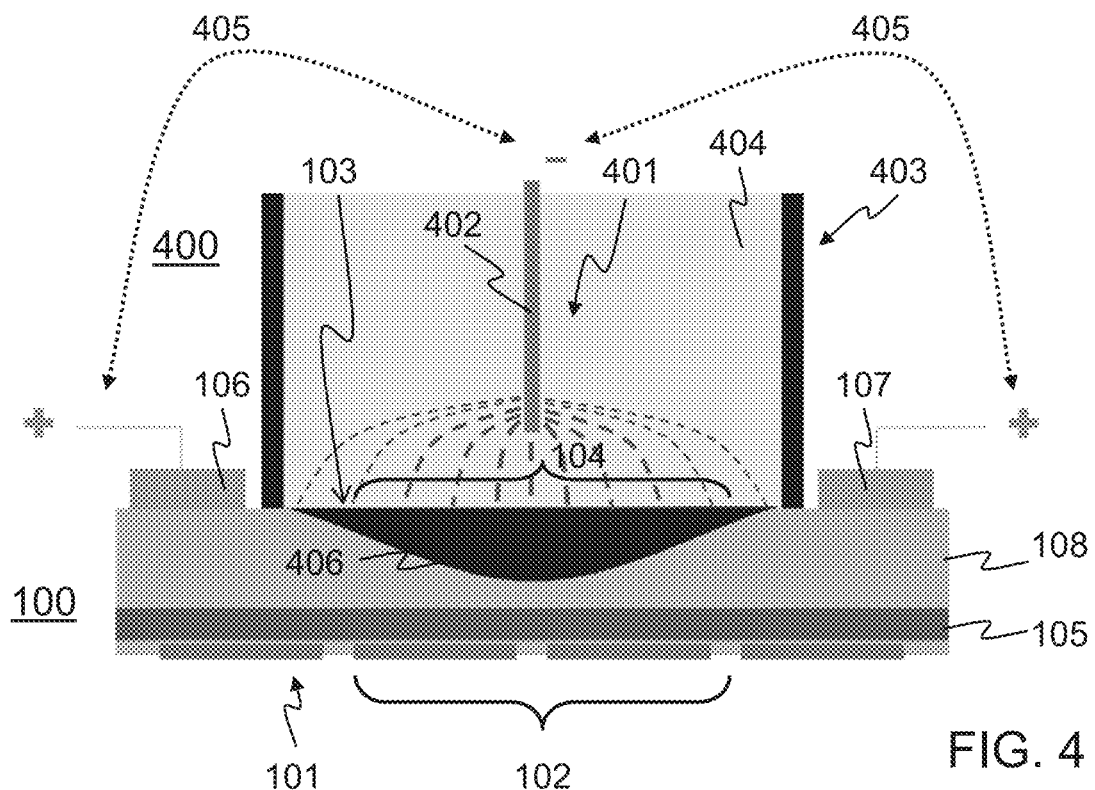
FIG. 4 is a schematic cross-sectional view of the substrate coupled to an electrochemical treatment device in an intermediate stage of a second exemplary method of processing the substrate.
Figure 5:
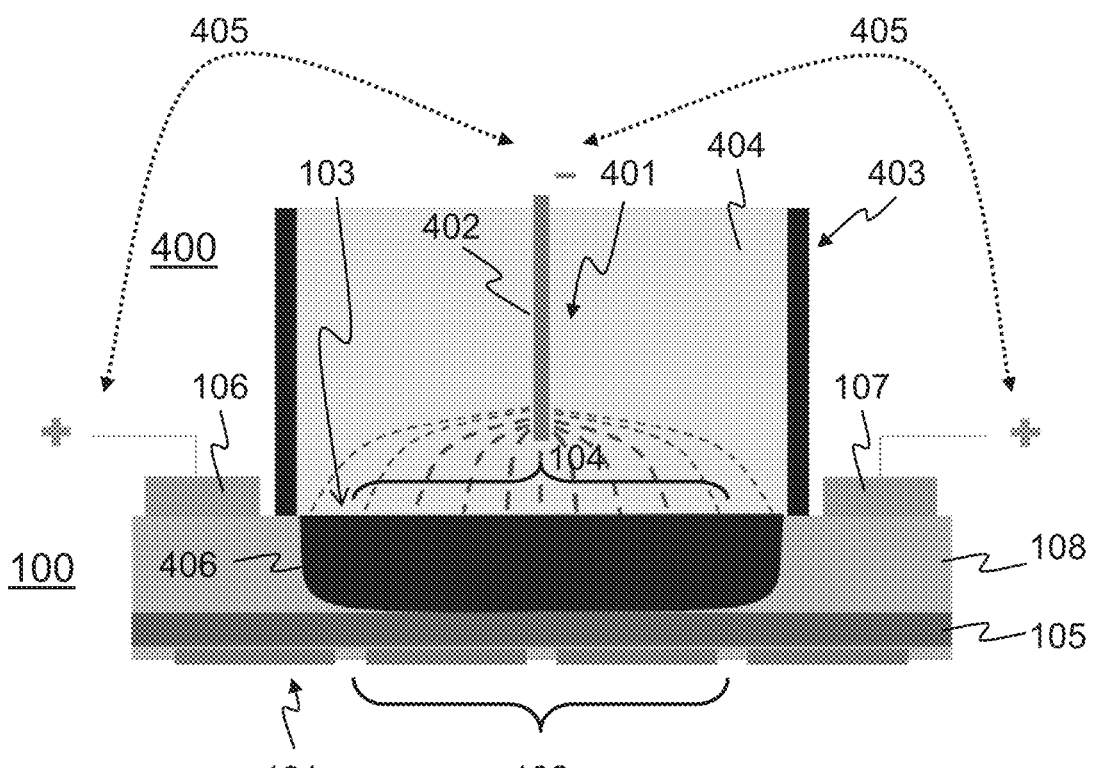
FIG. 5 is a schematic cross-sectional view of the substrate coupled to the electrochemical treatment device in a final stage of the second exemplary method of processing the substrate.

FIGS. 4 and 5 schematically illustrate a second exemplary method of processing a substrate 100. FIG. 4 provides a schematic cross-sectional view of the substrate 100 coupled to an electrochemical treatment device 400 in an intermediate stage of the second exemplary method. FIG. 5 provides a schematic cross-sectional view of the substrate 100 coupled to the electrochemical treatment device 400 in a final stage of the second exemplary method.

In the second exemplary method, the electrochemical treatment device 400 comprises an electrode arrangement 401 that is different from that used in the first exemplary method. In the second exemplary method, the electrode arrangement 401 comprises a rod-like electrode 402 that has an end facing a central area in the exposed zone 104. For the rest, the electrochemical treatment device 400 is similar. A container 403 contains a chemically reactive substance 404 in which the electrode arrangement 401 is present.

In the second exemplary method, a voltage 405 is applied between, on the one hand, the rod-like electrode 402 within the chemically reactive substance 404 and, on the other hand, the two electrodes 106, 107 disposed on the rear side 103 of the substrate 100. The rod-like electrode 402 within the chemically reactive substance 404 constitutes a cathode, whereas the two electrodes 106, 107 disposed on the rear side 103 of the substrate 100 constitute an anode. Accordingly, an electrical potential is laterally applied to the exposed zone 104 on the rear side 103 of the substrate 100. This causes a lateral flow of electrical current in the exposed zone 104.

However, the rod-like electrode 402 causes the electrical potential to be applied to the exposed zone 104 in a non-homogenous fashion. The electrical potential is higher in the central area in the exposed zone 104, which is near the end of the rod-like electrode 402, than in a peripheral area of the exposed zone 104. As a result, the lateral flow of electrical current has a somewhat higher density in the central area of the exposed zone 104 of the substrate 100 than in the peripheral area. As a result, pores will be formed inwardly from the central area at a somewhat faster rate than the in a peripheral area of the exposed zone 104.

In FIGS. 4 and 5, a dark area again indicates a volume 406 in the substrate 100 where pore have been formed as a result of the first exemplary method of processing. FIG. 4 illustrates that, in the intermediate stage, this volume 406 with pores has a greater depth in the central area than in the peripheral area of the exposed zone 104 of the substrate 100. This is because the lateral flow of electrical current has a somewhat higher density in the central area of the exposed zone 104 of the substrate 100 than in the peripheral area, as explained hereinbefore.

FIG. 5 illustrates that, in the final stage, the volume 406 with pores has grown such that this volume 406 substantially extends to the electrically insulating layer 105 throughout the exposed zone 104 of the substrate 100. In the vicinity of the electrical circuit 102, the substrate 100 is essentially porous. Once the substrate 100 has been processed in accordance with the second exemplary method, the electrical circuit 102 is adjacent to a less lossy medium compared with the substrate 100 in its original state illustrated in FIG. 1, but also compared with the substrate 100 processed in accordance with first exemplary method described hereinbefore with reference to FIGS. 2 and 3.

Figure 6:
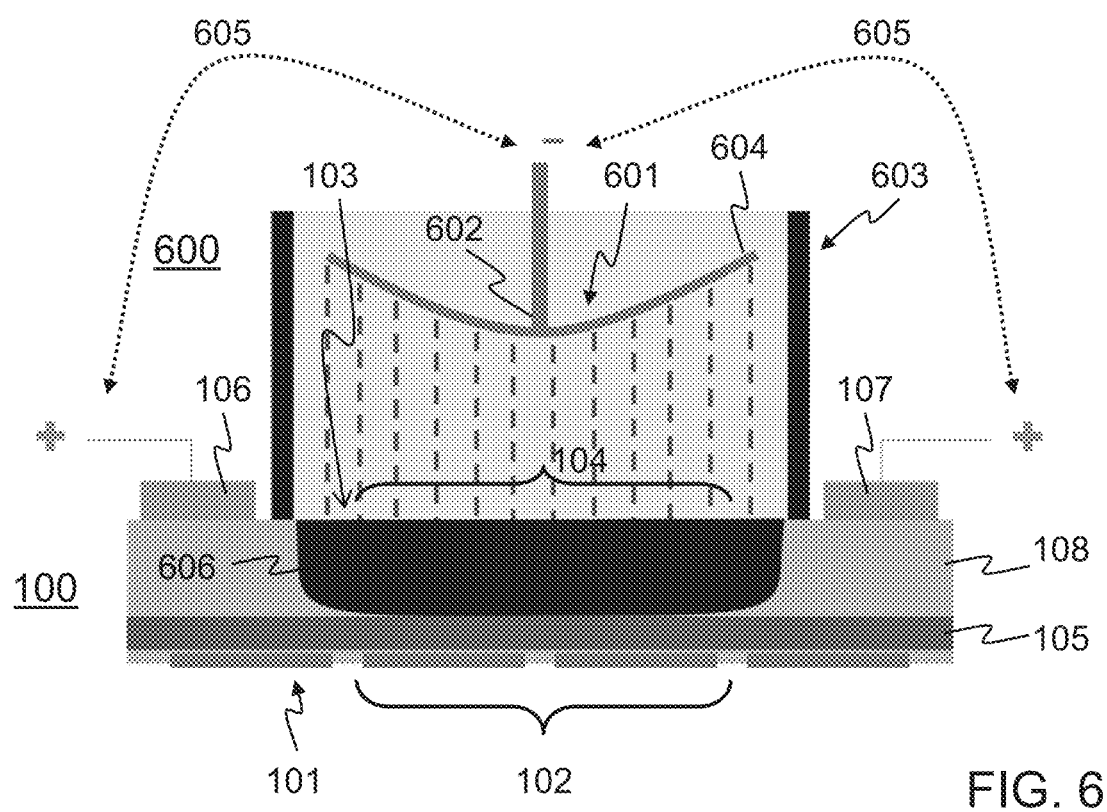
FIG. 6 is a schematic cross-sectional view of the substrate coupled to an electrochemical treatment device in a final stage of a third exemplary method of processing the substrate.

FIG. 6 schematically illustrates a third exemplary method of processing a substrate 100. FIG. 6 provides a schematic cross-sectional view of the substrate 100 coupled to an electrochemical treatment device 600 in a final stage of the third exemplary method.

In the third exemplary method, the electrochemical treatment device 600 comprises an electrode arrangement 601 that is different from that used in the first and second exemplary methods. In the third exemplary method, the electrode arrangement 601 comprises a curve-shaped electrode 602. The curve-shaped electrode 602 has a central area that faces a central area in the exposed zone 104 on the rear side 103 of the substrate 100. A peripheral area of the curve-shaped electrode 602 faces a peripheral area of the exposed zone 104. The curve-shaped electrode 602 has a curvature such that the central area of the curve-shaped electrode 602 is relatively close to the central area of the exposed zone 104. The peripheral area of the curve-shaped electrode 602 is relatively distant from the peripheral area of the exposed zone 104. For the rest, the electrochemical treatment device 600 may be similar to those that used in the first and second exemplary methods. A container 603 contains a chemically reactive substance 604 in which the electrode arrangement 601 is present.

In the third exemplary method, a voltage 605 is applied between, on the one hand, the curve-shaped electrode 602 within the chemically reactive substance 604 and, on the other hand, the two electrodes 106, 107 disposed on the rear side 103 of the substrate 100. The curve-shaped electrode 602 within the chemically reactive substance 604 constitutes a cathode, whereas the two electrodes 106, 107 disposed on the rear side 103 of the substrate 100 constitute an anode. Accordingly, an electrical potential is laterally applied to the exposed zone 104 on the rear side 103 of the substrate 100. This causes a lateral flow of electrical current in the exposed zone 104.

The curve-shaped electrode 602 causes the electrical potential to be applied to the exposed zone 104 in a non-homogenous fashion. The electrical potential is higher in the central area in the exposed zone 104, which is relatively near to the curve-shaped electrode 602, than in a peripheral area of the exposed zone 104, which is more distant to the curve-shaped electrode 602. As a result, the lateral flow of electrical current has a somewhat higher density in the central area of the exposed zone 104 of the substrate 100 than in the peripheral area. As a result, pores will be formed inwardly from the central area at a somewhat faster rate than the in a peripheral area of the exposed zone 104.

In FIG. 6, a dark area again indicates a volume 606 in the substrate 100 where pore have been formed as a result of the first exemplary method of processing. FIG. 6 illustrates that, in the final stage, the volume 606 with pores has grown such that this volume substantially extends to the electrically insulating layer 105 throughout the exposed zone 104 of the substrate 100. In the vicinity of the electrical circuit 102, the substrate 100 is essentially porous. Once the substrate 100 has been processed in accordance with the third exemplary method, the electrical circuit 102 is adjacent to a less lossy medium compared with the substrate 100 in its original state illustrated in FIG. 1, but also compared with the substrate 100 processed in accordance with first exemplary method described hereinbefore with reference to FIGS. 2 and 3.

The second and third exemplary methods of processing illustrated in FIGS. 4 and 5 and in FIG. 6, respectively, are examples of a technique wherein an electrode arrangement within a chemically reactive substance has a shape that causes the electrical potential to be applied to the exposed zone 104 in a non-homogenous fashion. This allows defining relatively precisely a volume within the substrate 100 where the substrate 100 is altered, namely by means of the shape of the electrode arrangement. Moreover, this may further allow defining a varying degree of alteration throughout the volume, or a varying form of alteration throughout the volume, or both. In the presented embodiments, applying the electrical potential laterally to the exposed zone 104 in a non-homogenous fashion, contributes to achieving that the substrate 100 is essentially porous in the vicinity of the electrical circuit 102. This then contributes to achieving that the substrate 100 becomes a more loss-free medium for the electrical circuit 102.

Figure 7:
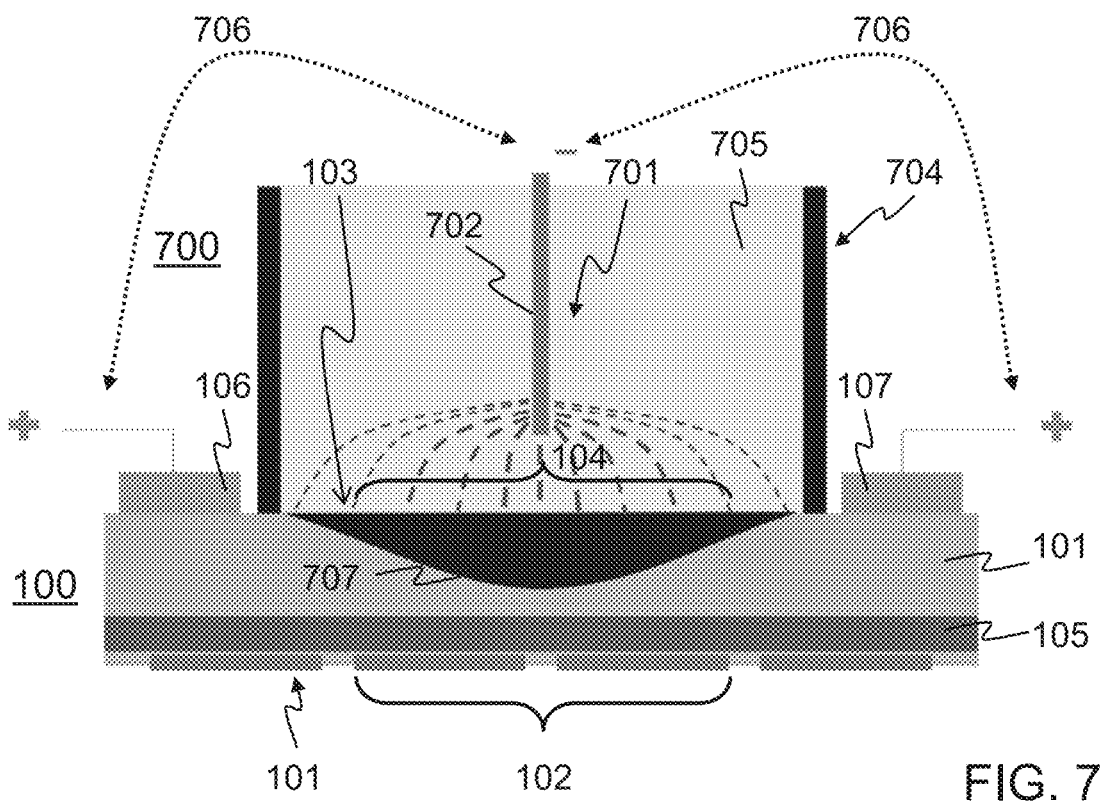
FIG. 7 is a schematic cross-sectional view of the substrate coupled to an electrochemical treatment device in a first stage of a fourth exemplary method of processing the substrate.
Figure 8:
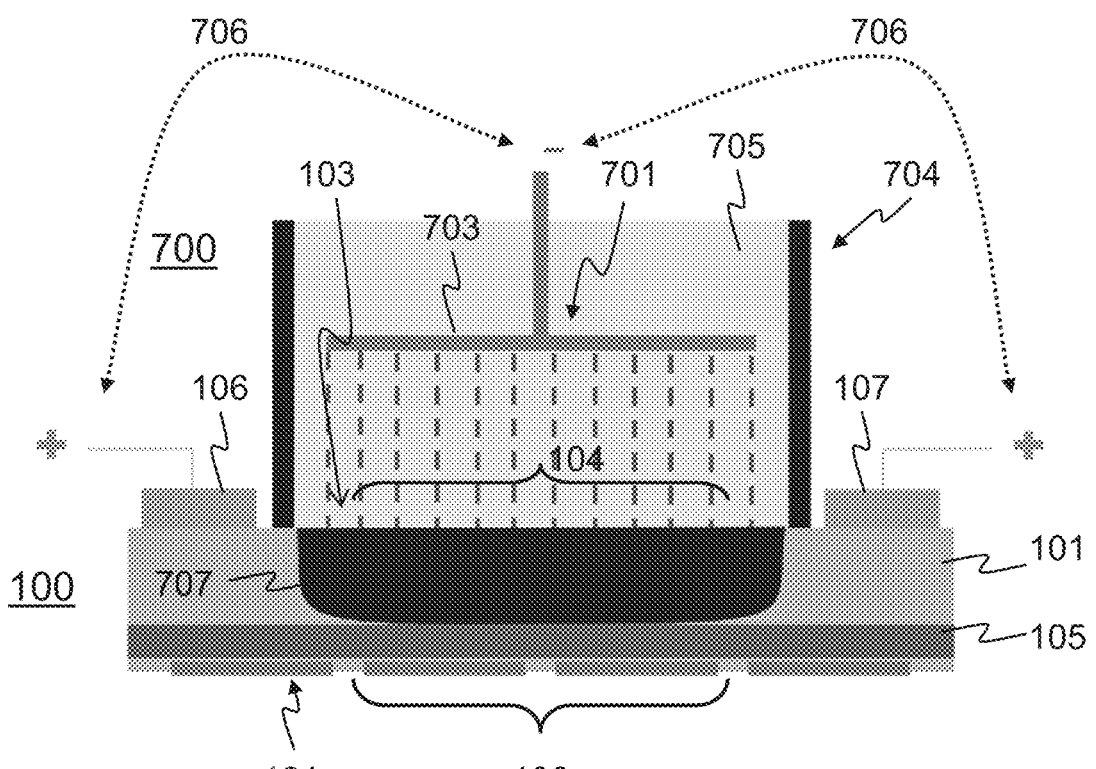
FIG. 8 is a schematic cross-sectional view of the substrate coupled to the electrochemical treatment device in a second, final stage of the fourth exemplary method of processing the substrate.

FIGS. 7 and 8 schematically illustrate a fourth exemplary method of processing a substrate 100. FIG. 7 provides a schematic cross-sectional view of the substrate 100 coupled to an electrochemical treatment device 700 in a first stage of the fourth exemplary method. FIG. 8 provides a schematic cross-sectional view of the substrate 100 coupled to the electrochemical treatment device 700 in a second, final stage of the fourth exemplary method.

In the fourth exemplary method, the electrochemical treatment device 700 comprises an electrode arrangement 701 that is different from that used in the exemplary methods presented hereinbefore. In the fourth exemplary method, the electrode arrangement 701 comprises, in a first treatment period, a rod-like electrode 702 similar to that used in the second exemplary method described hereinbefore with reference to FIGS. 4 and 5. In a subsequent, second treatment period, the electrode arrangement 701 comprises a plate-like electrode 703 similar to that used in the first exemplary method described hereinbefore with reference to FIGS. 2 and 3. For the rest, the electrochemical treatment device 700 is similar. A container 704 contains a chemically reactive substance 705 in which the electrode arrangement 701 is present.

FIG. 7 illustrates that, in the first treatment period of the fourth exemplary method, a voltage 706 is applied between, on the one hand, the rod-like electrode 702 within the chemically reactive substance 705 and, on the other hand, the two electrodes 106, 107 disposed on the rear side 103 of the substrate 100. The rod-like electrode 702 within the chemically reactive substance 705 constitutes a cathode, whereas the two electrodes 106, 107 disposed on the rear side 103 of the substrate 100 constitute an anode. Accordingly, an electrical potential is laterally applied to the exposed zone 104 on the rear side 103 of the substrate 100. This causes a lateral flow of electrical current in the exposed zone 104.

Similar to the second exemplary method, the rod-like electrode 702 causes the electrical potential to be applied to the exposed zone 104 in a non-homogenous fashion. The electrical potential is higher in a central area in the exposed zone 104, which is near the end of the rod-like electrode 702, than in a peripheral area of the exposed zone 104. As a result, the lateral flow of electrical current has a somewhat higher density in the central area of the exposed zone 104 of the substrate 100 than in the peripheral area. As a result, pores will be formed inwardly from the central area at a somewhat faster rate than the in a peripheral area of the exposed zone 104.

In FIG. 7, a dark area again indicates a volume 707 in the substrate 100 where pore have been formed thus far at the first stage, which is near the end of the first treatment period of the fourth exemplary method. FIG. 7 illustrates that, in the first stage, this volume 707 with pores has a greater depth in the central area than in the peripheral area of the exposed zone 104 of the substrate 100. This is because the lateral flow of electrical current has a somewhat higher density in the central area of the exposed zone 104 of the substrate 100 than in the peripheral area, as explained hereinbefore.

FIG. 8 illustrates that, in the second, subsequent stage, which is near the end of the second treatment period of the fourth exemplary method, the volume 707 with pores has grown such that this volume 707 substantially extends to the electrically insulating layer 105 throughout the exposed zone 104 of the substrate 100. In the vicinity of the electrical circuit 102, the substrate 100 is essentially porous. Once the substrate 100 has been processed in accordance with the fourth exemplary method, the electrical circuit 102 is adjacent to a less lossy medium compared with the substrate 100 in its original state illustrated in FIG. 1, but also compared with the substrate 100 processed in accordance with first exemplary method described hereinbefore with reference to FIGS. 2 and 3.

The fourth exemplary method of processing illustrated in FIGS. 7 and 8 is an example of a technique wherein an electrode arrangement within a chemically reactive substance has a shape that changes at least one time during electrochemical treatment. This may further contribute to precisely defining a volume in which the substrate 100 is altered by electrochemical treatment. In the present embodiments, where pores are formed in the substrate 100, this may thus further contribute to the substrate 100 becoming a more loss-free medium for the electrical circuit 102.

Figure 9:
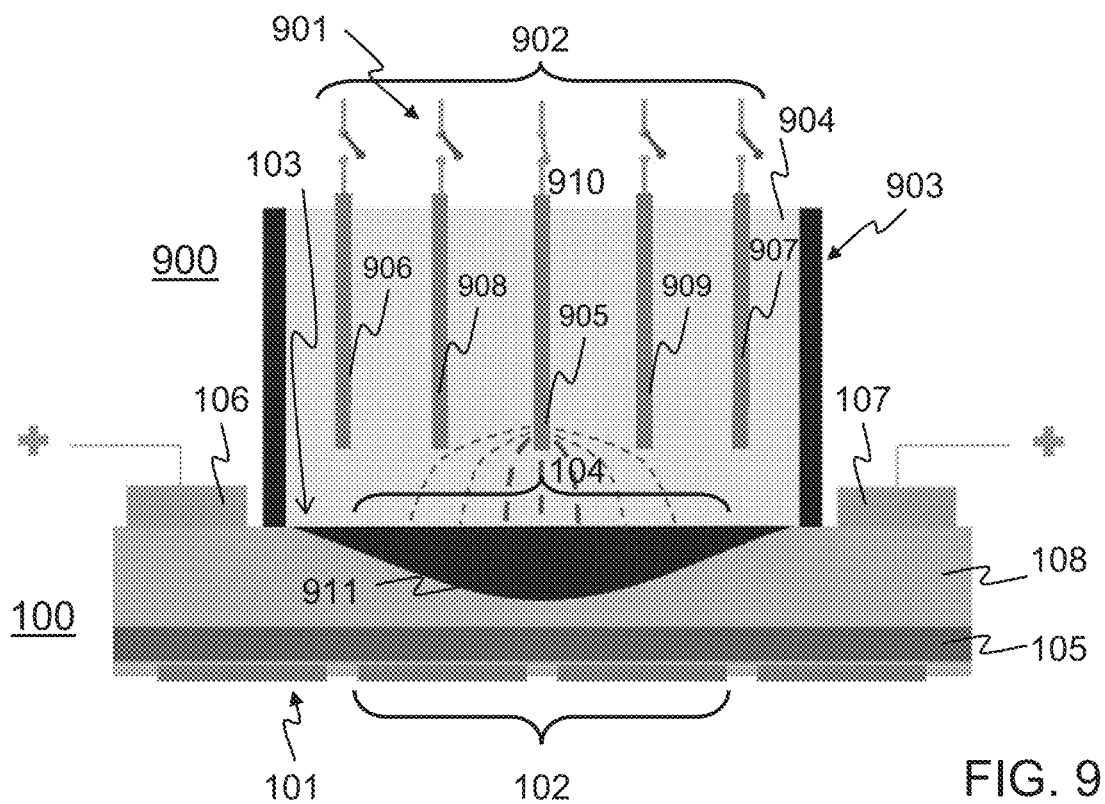
FIG. 9 is a schematic cross-sectional view of the substrate coupled to an electrochemical treatment device in a first stage of a fifth exemplary method of processing the substrate.
Figure 10:
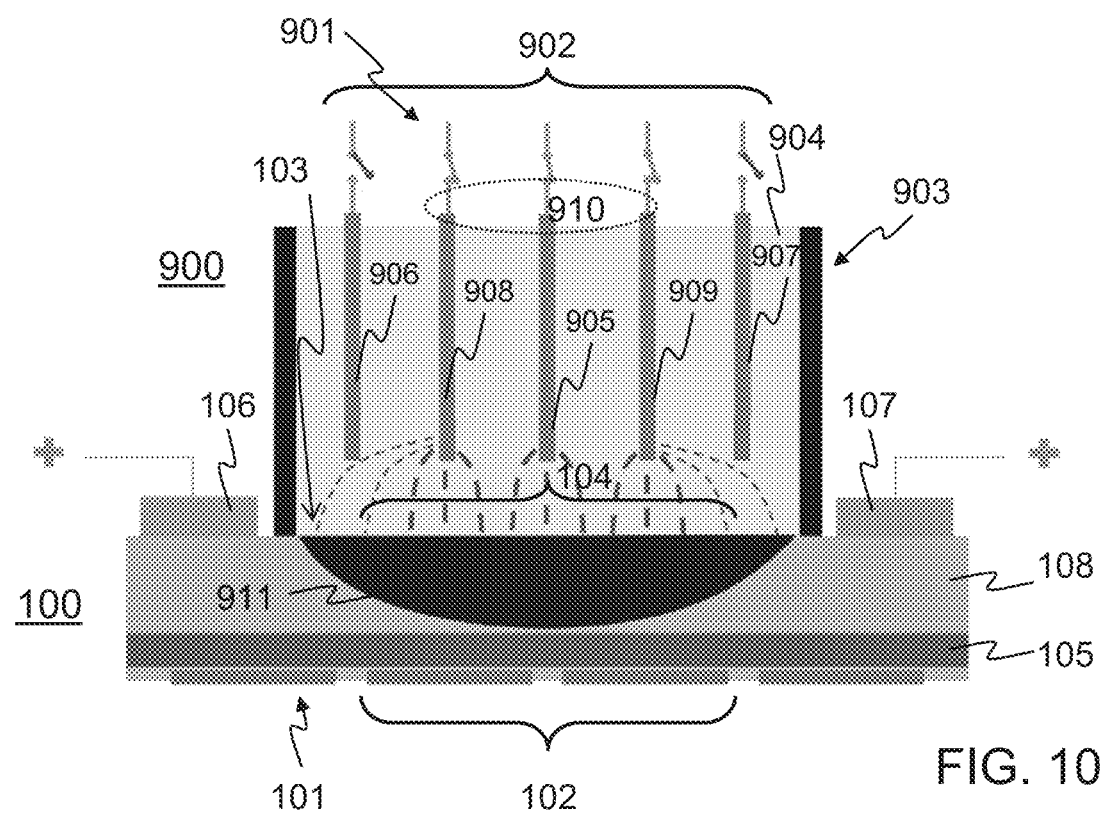
FIG. 10 is a schematic cross-sectional view of the substrate coupled to the electrochemical treatment device in a second, subsequent stage of the fifth exemplary method of processing the substrate.
Figure 11:
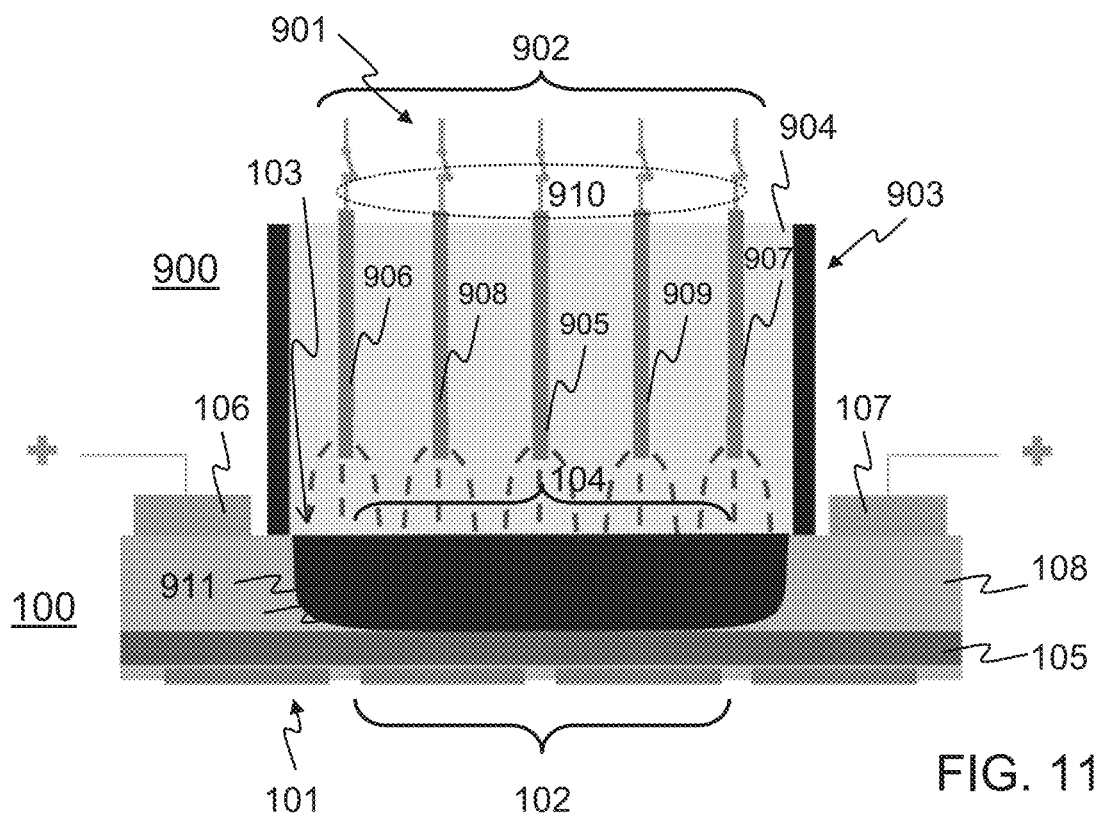
FIG. 11 is a schematic cross-sectional view of the substrate coupled to the electrochemical treatment device in a third, final stage of the fifth exemplary method of processing the substrate.

FIGS. 9, 10 and 11 schematically illustrate a fifth exemplary method of processing a substrate 100. FIG. 9 represents the substrate 100 coupled to an electrochemical treatment device 900 in a first stage of the fifth exemplary method. FIG. 10 represents the substrate 100 coupled to the electrochemical treatment device 900 in a second, subsequent stage of the fifth exemplary method. FIG. 11 represents the substrate 100 coupled to the electrochemical treatment device 900 in a third, final stage of the fifth exemplary method.

In the fifth exemplary method, the electrochemical treatment device 900 comprises an electrode arrangement 901 that is different from that used in the previously presented exemplary methods. In this embodiment, the electrode arrangement 901 comprises an array of respective electrodes 902 to which respective voltages may be applied. For the rest, the electrochemical treatment device 900 is similar to the electrochemical treatment devices presented hereinbefore. A container 903 contains a chemically reactive substance 904 in which the electrode arrangement 901 is present.

In this embodiment, the electrodes of the array 902 each have a rod-like shape. The respective electrodes have respective positions with respect to the exposed zone 104 of the substrate 100. In this embodiment, the array comprises a central electrode 905, a group of peripheral electrodes 906, 907, and a group of intermediate electrodes 908, 909. The group of peripheral electrodes 906, 907 and the group of intermediate electrodes 908, 909 may be circularly arranged around the central electrode 905 in a concentric fashion.

The central electrode 905 faces a central area of the exposed zone 104. The pair peripheral electrodes 906, 907 face a peripheral area of the exposed zone 104. One peripheral electrode 906 faces one segment of the peripheral area, the other peripheral electrode 907 facing another, opposite segment of the peripheral area. The pair intermediate electrodes 908, 909 face an intermediate area of the exposed zone 104 that is located between the central area and the peripheral area. One intermediate electrode 908 faces one segment of the intermediate area, the other intermediate electrode 909 facing another, opposite segment of the intermediate area.

FIG. 9 illustrates that, in the first stage of the fifth exemplary method, a voltage 910 is applied to the central electrode 905 only. As a result, an electrical potential is applied to the exposed zone 104 in a non-homogenous fashion, somewhat similar to what has been described hereinbefore regarding the second exemplary method illustrated in FIGS. 3 and 4. The electrical potential causes a lateral flow of electrical current that has a somewhat higher density in a central area of the exposed zone 104 of the substrate 100 than in a peripheral area. As a result, pores will be formed inwardly from the central area at a somewhat faster rate than the in a peripheral area of the exposed zone 104. In FIG. 9, a dark area indicates a volume 911 in the substrate 100 where pore have been formed thus far.

FIG. 10 illustrates that, in the second, subsequent stage of the fifth exemplary method, a voltage 910 is applied to the central electrode 905 and the group of intermediate electrodes 908, 909. Consequently, the electrical potential that is applied to the exposed zone 104 is somewhat less non-homogenous than in the first stage of the fifth exemplary method. In the second, subsequent stage, the lateral flow of electrical current in the exposed zone 104 will have a density distribution that is different from that in the first stage. This will affect pore formation in the substrate 100. In FIG. 10 too, a dark area indicates the volume 911 in the substrate 100 where pores have been formed thus far. The volume 911 will further grow according to a geometrical growth rate distribution that is different from that in the first stage.

FIG. 11 illustrates that, in the third, final stage of the fifth exemplary method, a voltage 910 is applied to all the electrodes of the array, including the group of peripheral electrodes 906, 907. Consequently, the electrical potential that is applied to the exposed zone 104 is further somewhat less non-homogenous than in the second stage of the fifth exemplary method. In the third, final stage, the lateral flow of electrical current in the exposed zone 104 will have a density distribution that is different from that in the first and second stages. As explained, this affects pore formation in the substrate 100. In FIG. 11 too, a dark area indicates the volume 911 in the substrate 100 where pores have been formed.

The fifth exemplary method of processing illustrated in FIGS. 9, 10, and 11 is an example of a technique according to which at least a part of respective voltages applied to respective electrodes in an array of electrodes, change at least one time during an electrochemical treatment of a substrate 100. This may further contribute to precisely defining a volume in which the substrate 100 is altered by electrochemical treatment. Moreover, this may further contribute to defining a varying degree of alteration throughout the volume, or a varying form of alteration throughout the volume, or both. In the present embodiments, where pores are formed in the substrate 100, this may thus contribute to the substrate 100 becoming a more loss-free medium for the electrical circuit 102.

Figure 12:
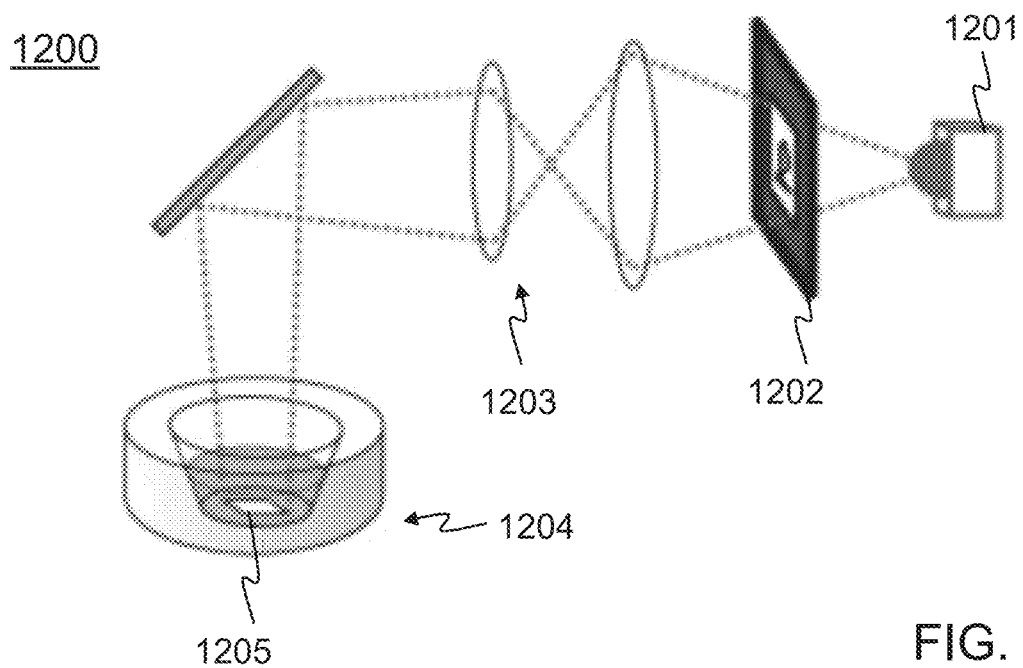
FIG. 12 is a schematic diagram of a photo-electrochemical treatment system for carrying out a sixth exemplary method of processing a substrate.

FIG. 12 illustrates a photo-electrochemical treatment system 1200 for carrying out a sixth exemplary method of processing a substrate. FIG. 12 provides a schematic diagram of the photo-electrochemical treatment system 1200.

The photo-electrochemical treatment system 1200 comprises a radiation source 1201, a mask 1202, a lens and projection system 1203, and an electrochemical treatment assembly 1204. The radiation source 1201 may be, for example, a light source. The mask 1202 may have a twodimensional translucent profile. The electrochemical treatment assembly 1204 may comprise, for example, an electrochemical treatment device similar to any of the electrochemical treatment devices discussed hereinbefore. In the electrochemical treatment assembly 1204, a substrate 1205 has been placed. Like the substrate 100 illustrated in FIG. 1, the substrate 1205 that undergoes the sixth exemplary method may have a front side comprising an electrical circuit. A rear side may have an exposed zone that faces the electrical circuit and that is in contact with a chemically reactive substance.

The substrate 1205 that undergoes the sixth exemplary method may be different from the substrate 100 illustrated in FIG. 1, to which any of the first to fifth exemplary methods may be applied. The substrate 1205 that undergoes the sixth exemplary method may comprise, at least in the exposed zone, a material that, when in contact with a chemically reactive substance, while an electrical current flows through the material, alters depending on radiation applied to the material. For example, the substrate 1205 that undergoes the sixth exemplary method may comprise a bulk section that is N-doped instead of P-doped as in the substrate 100 illustrated in FIG. 1. To form pores in N-doped semiconductor material, light is required in addition to the chemical substance and the electrical current. The higher the intensity of light that is projected on an area of N-doped semiconductor material under these conditions is, the higher rate at which pores are formed in this area.

In the sixth exemplary method, an electrical potential is laterally applied at least to the exposed zone on the rear side of the substrate 1205, while the exposed zone is in contact with a chemically reactive substance. In addition, the exposed zone of the substrate 1205 receives light, which may have a non-homogeneous intensity distribution over the exposed zone. For example, a central area of the exposed zone may receive a higher intensity of light than a peripheral area of the exposed zone. The mask 1202 essentially defines the non-homogeneous intensity distribution. The mask 1202 may thus define, at least partially, a pore formation rate distribution over the exposed zone of the substrate. Consequently, the mask 1202 defines a volume in which pores are formed, at least in terms of size and shape. This is thus yet another technique for achieving that the substrate 1205 becomes a more loss-free medium for the electrical circuit.

The first to sixth exemplary methods of processing illustrated in FIGS. 2 to 12 are examples of a general technique according to which an electrical potential is laterally applied to an exposed zone of a substrate. In the second to fifth exemplary methods, an electrical potential is laterally applied in a non-homogenous fashion in at least one of the following dimensions: space and time, so as to define at least one of the following characteristics: a volume within the substrate where the substrate is altered, a varying degree of alteration throughout the volume, and a varying form of alteration throughout the volume. In the sixth exemplary method, light may be used to achieve the same.

In the presented embodiments, pores are formed in the substrate to make the substrate a less lossy medium for the electrical circuit. In at least some of the exemplary methods, pore formation may be controlled in terms of pore size and pore density. This may further contribute to making the substrate less lossy. Namely, the greater the ratio is between the portion of the volume that is occupied by pores are and the remaining portion, which is still occupied by substrate material, the less lossy the volume where pores have been formed will be. It is particularly advantageous to control the pore formation so that this ratio is relatively high in the vicinity of the electrical circuit.

Figure 13:
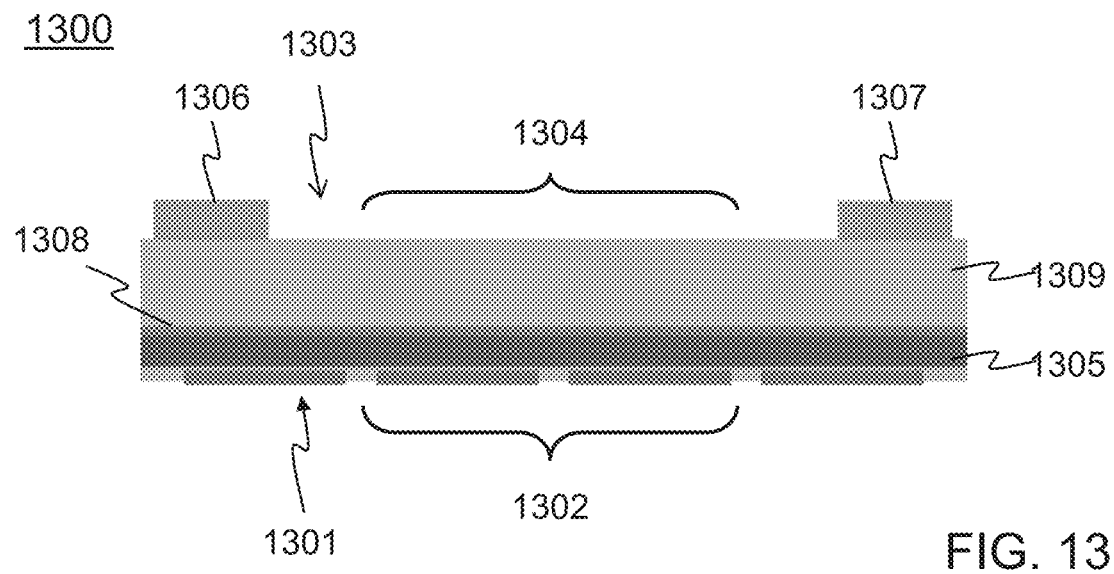
FIG. 13 is a schematic cross-sectional view of an improved substrate adapted to undergo an electrochemical treatment.

FIG. 13 illustrates an improved substrate 1300 adapted to undergo an electrochemical treatment, which may be in accordance with an exemplary method presented hereinbefore. FIG. 13 provides a schematic cross-sectional view of the improved substrate 1300. The improved substrate 1300 is a modified version of the substrate 100 illustrated in FIG. 1.

In the following respects, the improved substrate 1300 is similar to the substrate 100 illustrated in FIG. 1. The improved substrate 1300 also has a front side 1301 that comprises an electrical circuit 1302. A rear side 1303 of the improved substrate 1300 comprises an exposed zone 1304 that faces the electrical circuit 1302. Two electrodes 1306, 1307 are disposed on the rear side 1303 of the improved substrate 1300 similarly to the two electrodes 106, 107 on the substrate 100 illustrated in FIG. 1. The improved substrate 1300 may also comprise an electrically insulating layer 1305 disposed between the electrical circuit 1302, which is comprised in the front side 1301, and the rear side 1303.

Different from the substrate 100 illustrated in FIG. 1, the improved substrate 1300 comprises an alteration stop layer 1308. The alteration stop layer 1308 is disposed between the electrically insulating layer 1305 and the exposed zone 1304 on the rear side 1303. A bulk section 1309 of the improved substrate 1300 extends between the alteration stop layer 1308 and the rear side 1303. In this embodiment, the alteration stop layer 1308 is adjacent to the electrically insulating layer 1305. The alteration stop layer 1308 comprises a material that is relatively resistant to the chemically reactive substance used in at least one of the exemplary methods that have been presented hereinbefore. The expression "relatively resistant" may be interpreted as meaning chemically more resistant than the substrate, or at least material in a bulk section thereof. In this embodiment, the alteration stop layer 1308 may also be chemically more resistant to the chemically reactive substance than the electrically insulating layer 1305.

The alteration stop layer 1308 thus effectively forms a barrier that prevents the chemically reactive substance from continuing its way from the rear side 1303 of the improved substrate 1300 towards the front side 1301. In this embodiment, the alteration stop layer 1308 protects, in effect, the electrically insulating layer 1305 from the chemically reactive substance. For example, hydrofluoric acid in the chemically reactive substance may erode silicon oxide in the electrically insulating layer 1305.

The following desired results may be obtained more easily by using the improved substrate 1300 illustrated in FIG. 13 in an electrochemical treatment, than by using the substrate 100 illustrated in FIG. 1. One desired result is obtaining a volume with pores having a size and shape such that essentially no non-porous substrate material remains in the vicinity of the electrical circuit 1302 once the electrochemical treatment has been carried out. Another desired result is leaving the electrically insulating layer 1305 substantially intact. The alteration stop layer 1308 makes it relatively easy to achieve this latter desired result. Accordingly, the electrochemical treatment can be focused on obtaining a most loss-free substrate.

The alteration stop layer 1308 may comprise a semiconductor material. For example, the alteration stop layer 1308 may comprise polycrystalline silicon, in particular polycrystalline silicon that is substantially free of any doping material. Such an embodiment of the improved substrate 1300 can be manufactured using conventional semiconductor manufacturing technologies at moderate cost. That is, the improved substrate 1300 can be compatible with conventional semiconductor manufacturing technologies in case polycrystalline silicon essentially forms the alteration stop layer 1308.

What is more, polycrystalline silicon is a relatively loss free medium. Referring to FIG. 13, this is an advantageous feature given that the alteration stop layer 1308 is relatively close to the electrical circuit 1302. The electrical circuit 1302 will thus be in the vicinity of a relatively loss free medium if the alteration stop layer 1308 essentially comprises polycrystalline silicon and if substrate material in the vicinity of the electrical circuit 1302 has been made porous.

There is an advantage to the alteration stop layer 1308 being essentially formed of semiconductor material, in particular polycrystalline silicon, rather than being essentially formed of an electrically insulating material, such as, for example, silicon nitride, or a polymer. In order to explain this advantage, let it be assumed that the alteration stop layer 1308 in the improved substrate 1300 illustrated in FIG. 13 is electrically insulating. Let it further be assumed that the improved substrate 1300 is undergoing an electrochemical treatment, which is at a stage where pores have been formed in a volume relatively close to the alteration stop layer 1308. Only a relatively thin layer of nonporous substrate material will then remain between this volume and the alteration stop layer 1308, which is electrically insulating. Essentially no electrical current will pass through this thin layer of nonporous substrate material that remains. Consequently, essentially no pores will be formed in this remaining layer. That is, a relatively lossy layer of nonporous substrate material may remain in the vicinity of the electrical circuit 1302 once the electrical chemical treatment has been carried out.

Let it now be assumed that the alteration stop layer 1308 in the improved substrate 1300 illustrated in FIG. 13 is semiconducting. Let it further be assumed that the improved substrate 1300 is undergoing an electrochemical treatment, which is at a stage as described hereinbefore, wherein only a relatively thin layer of nonporous substrate material remains alongside the alteration stop layer 1308. Since the alteration stop layer 1308 is semiconducting, some electrical current will continue to pass through this thin layer of nonporous substrate material that remains. Consequently, pore formation may continue in this remaining layer. Accordingly, substrate material in the vicinity of the electrical circuit 1302 may become essentially entirely porous. Once the electrical chemical treatment has been carried out, the electrical circuit 1302 may be in the vicinity of a less lossy medium than if the alteration stop layer 1308 were electrically insulating.

Figure 14:
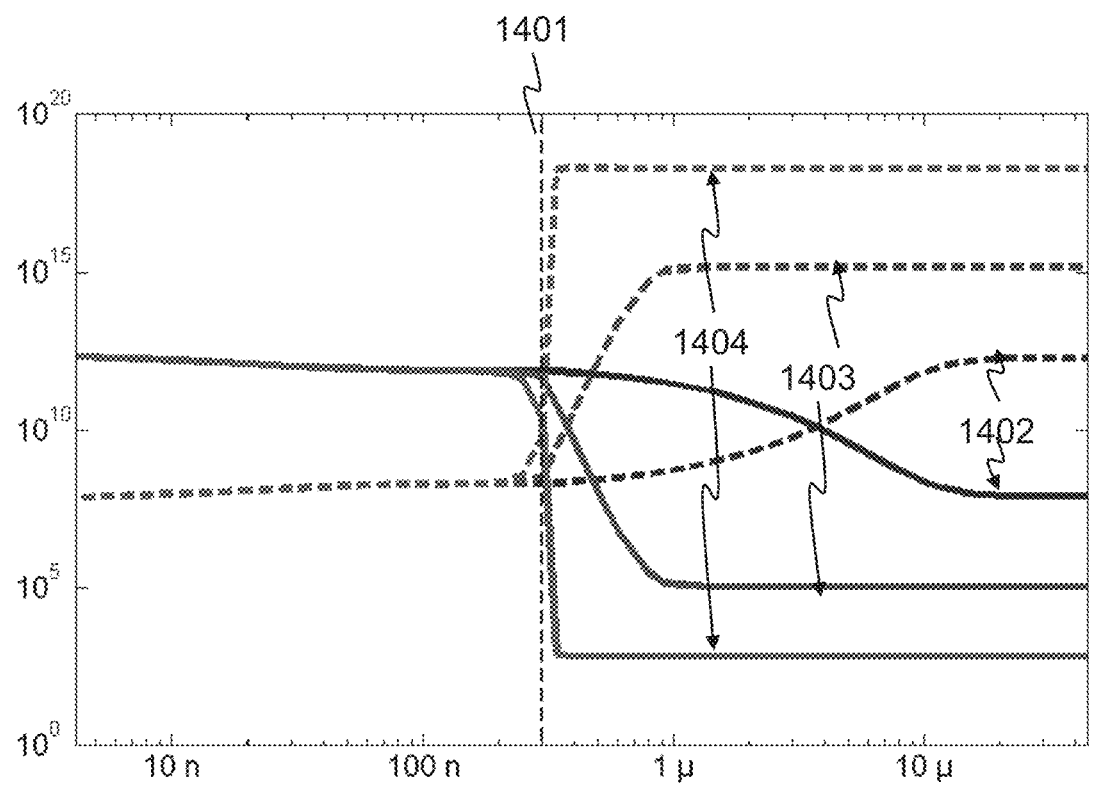
FIG. 14 is a graph in which carriers concentrations in a section of the improved substrate are plotted as a function of depth within the improved substrate.

FIG. 14 is a graph illustrating carrier concentrations in a section of the improved substrate 1300 that includes the alteration stop layer 1308, whereby the alteration stop layer 1308 is essentially formed of polycrystalline silicon. The graph comprises a horizontal axis that represents depth within the improved substrate 1300 with reference to a plane where the electrically insulating layer 1305 interfaces with the alteration stop layer 1308. A vertical broken line 1401 indicates a depth where the alteration stop layer 1308 interfaces with the bulk section 1309 of the improved substrate 1300, which is to be altered by electrochemical treatment. Accordingly, the vertical broken line 1401 divides the graph into a left-hand part representing the alteration stop layer 1308, and a right-hand part representing at least a portion of the bulk section 1309 of the improved substrate 1300. The graph comprises a vertical axis that represents carrier concentrations, which are expressed as number of carriers per cubic centimeter.

The graph comprises three pair of curves 1402, 1403, 1404. In each pair, a curve in full lines represents carriers of the N-type, that is, electrons, whereas a curve in broken lines represents carriers of the P-type, that is, holes. In a first pair of curves 1402, carrier concentrations are plotted against depth, whereby the bulk section 1309 of the improved substrate 1300 has a resistivity of 8 kΩ cm. In a second pair of curves 1403, carrier concentrations are plotted against depth, whereby the bulk section 1309 has a resistivity of 10 Ωcm. In a third pair of curves 1404, carrier concentrations are plotted against depth, whereby the bulk section 1309 has a resistivity of 10 mΩ cm. For each curve it holds that the bulk section 1309 comprises P-doped silicon with respective doping concentrations for the respective pairs of curves.

The graph of FIG. 14 shows that the polycrystalline silicon alteration stop layer 1308 is resistant to hydrofluoric acid in the chemically reactive substance. Namely, it requires a concentration of P-type carriers exceeding 1012 for the hydrofluoric acid to significantly erode the polycrystalline silicon. The graph of FIG. 14 shows that the concentration of P-type carriers is well below this threshold in the polycrystalline silicon, which is represented in the left-hand portion of this graph. The fact that the polycrystalline silicon is interfaced with the bulk section 1309 of the improved substrate 1300 affects the concentration of P-type carriers only over a negligibly small depth range in the polycrystalline silicon at the interface.

Figure 15:
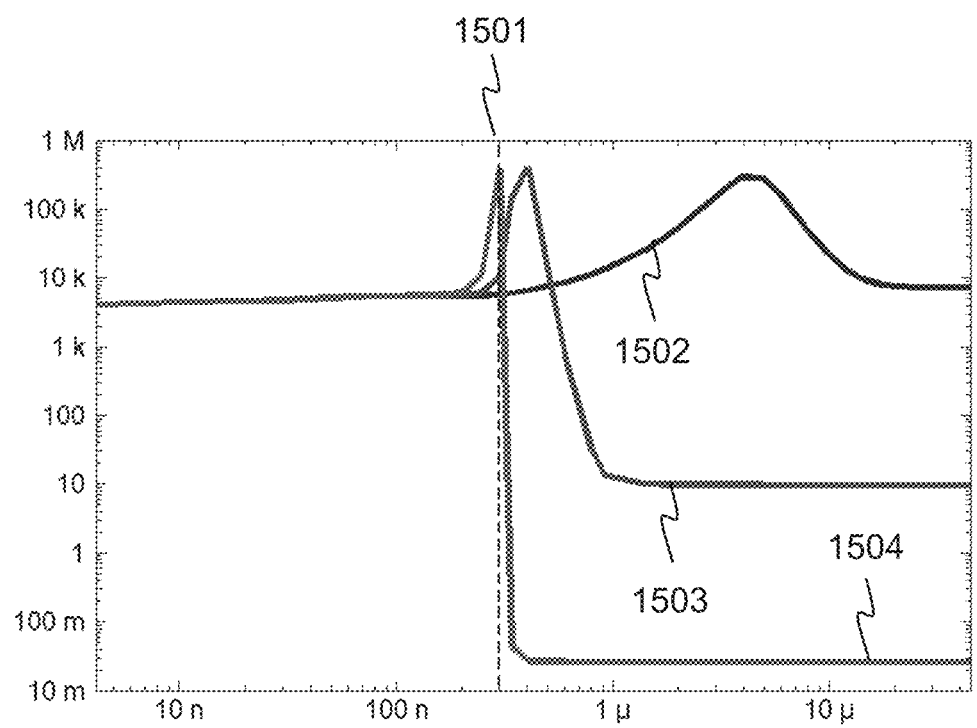
FIG. 15 is a graph in which resistivity of the section of the improved substrate is plotted a function of depth within the improved substrate.

FIG. 15 is a graph illustrating resistivity in the section of the improved substrate 1300 mentioned hereinbefore, which includes the alteration stop layer 1308, whereby the alteration stop layer 1308 is essentially formed of polycrystalline silicon. The graph comprises a horizontal axis similar to that of FIG. 14, representing depth within the improved substrate 1300 with reference to the plane where the electrically insulating layer 1305 interfaces with the alteration stop layer 1308. Similarly, a vertical broken line 1501 indicates the depth where the alteration stop layer 1308 interfaces with the bulk section 1309 of the improved substrate 1300. The vertical broken line 1501 again divides the graph into a left-hand part representing the alteration stop layer 1308, and a right-hand part representing the same portion of the bulk section 1309 as in FIG. 14. The graph comprises a vertical axis that represents resistivity, which is expressed as Ω cm.

The graph comprises three curves 1502, 1503, 1504. In a first curve 1502, resistivity is plotted against depth, whereby the bulk section 1309 of the improved substrate 1300 has a resistivity of 8 kΩ cm. In a second curve 1503, resistivity is plotted against depth, whereby the bulk section 1309 has a resistivity of 10Ω cm. In a third curve 1504, resistivity is plotted against depth, whereby the bulk section 1309 has a resistivity of 10 mΩ cm. Here too, for each curve it holds that the bulk section 1309 comprises P-doped silicon with respective doping concentrations for the respective pairs of curves.

The graph of FIG. 15 shows that the resistivity is relatively high in the polycrystalline silicon alteration stop layer 1308. The resistivity is at least 4 kΩ cm, which implies that the polycrystalline silicon alteration stop layer 1308 is relatively loss free. Again, the fact that the polycrystalline silicon is interfaced with the bulk section 1309 of the improved substrate 1300 only has a negligible effect on the resistivity. The effect is confined to a negligibly small depth range in the polycrystalline silicon at the interface.

Figure 16:
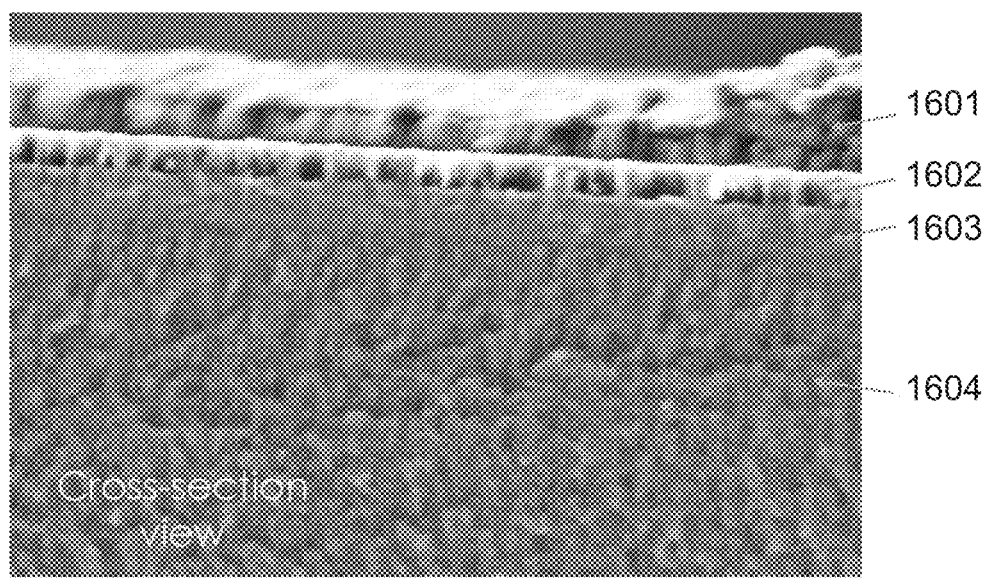
FIG. 16 is a photo of a cross section of an improved substrate that has undergone an electrochemical treatment.

FIG. 16 illustrates an improved substrate 1600 that has undergone an electrochemical treatment. FIG. 16 presents a photo of a cross section of this processed improved substrate 1600. The processed improved substrate 1600 comprises an electrical circuit 1601 on top of a silicon oxide insulating layer 1602, a polycrystalline silicon alteration stop layer 1603, and a remaining bulk section 1604 of the improved substrate 1600. The bulk section 1604 is essentially entirely porous, right up to the polycrystalline silicon alteration stop layer 1603. Consequently, the processed improved substrate 1600 constitute a relatively loss free medium for the electrical circuit 1601. The polycrystalline silicon alteration stop layer 1603 has essentially not been affected by the electrochemical treatment. The photo shows that there is a neat tight interface between the polycrystalline silicon alteration stop layer 1603 and the porous bulk section 1604 of the improved substrate 1600.

Figure 17:
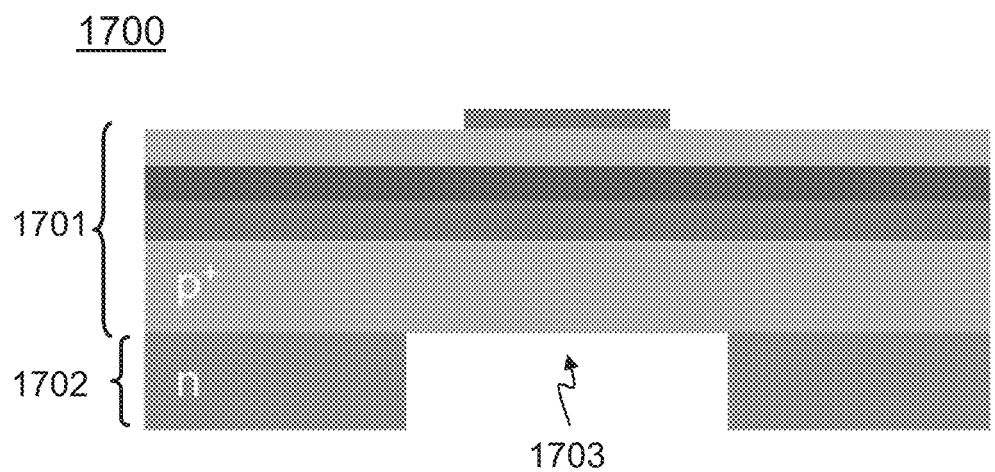
FIG. 17 is a schematic cross-sectional view of a substrate assembly comprising an improved substrate.

FIG. 17 illustrates a substrate assembly 1700 comprising an improved substrate 1701. FIG. 17 provides a schematic cross-sectional view of the substrate assembly 1700. The substrate assembly 1700 basically corresponds to an improved substrate 1701 to which another substrate 1702 has been fixed. The improved substrate 1701 in the substrate assembly 1700 may be similar to the improved substrate 1300 described hereinbefore with reference to FIG. 13. The other substrate 1702 may provide mechanical support for the improved substrate 1701 after an electrochemical treatment thereof. The electrochemical treatment may weaken the improved substrate 1701 because, for example, pores have been formed therein. The other substrate 1702, which provides mechanical support, will be referred to hereinafter as support substrate 1702.

The support substrate 1702 should be chemically resistant to the chemically reactive substance used in the electrochemical treatment. For example, the support substrate 1702 may comprise N-doped silicon that is relatively resistant to a hydrofluoric acid. The support substrate 1702 comprises an orifice 1703 that leaves a zone exposed on the rear side of the improved substrate 1701 where the improved substrate 1701 is to be altered by electrochemical treatment. The support substrate 1702 may thus constitute a mask defining at least one zone in the improved substrate 1701 that will be altered by the electrochemical treatment. The support substrate 1702 may be fixed to the improved substrate 1701 by means of, for example, gluing.

Figure 18:
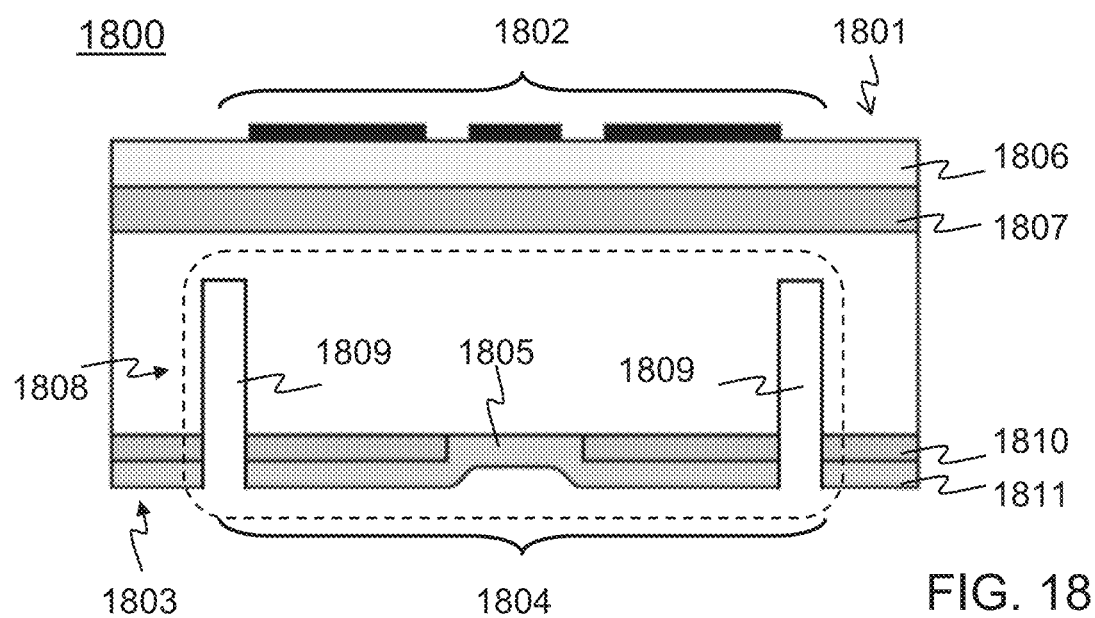
FIG. 18 is a schematic cross-sectional view of an alternative improved substrate adapted to undergo an electrochemical treatment.
Figure 19:
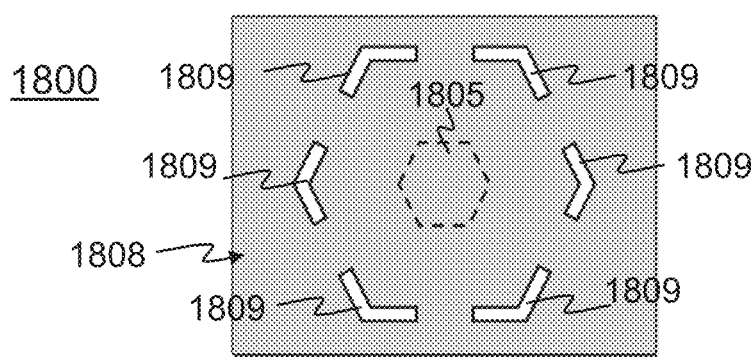
FIG. 19 is a schematic rear view of the alternative improved substrate.

FIGS. 18 and 19 schematically illustrate an alternative improved substrate 1800. FIG. 18 provides a schematic cross-sectional view of the alternative improved substrate 1800. FIG. 19 provides a schematic rear view of the alternative improved substrate 1800.

In the following respects, the alternative improved substrate 1800 is similar to the improved substrate 1300 illustrated in FIG. 13. The alternative improved substrate 1800 also has a front side 1801 that comprises an electrical circuit 1802. A rear side 1803 of the alternative improved substrate 1800 comprises an exposed zone 1804 that faces the electrical circuit 1802. An electrode 1805 is disposed on the rear side 1802 of the alternative improved substrate 1800. The alternative improved substrate 1800 may also comprise an electrically insulating layer 1806 disposed between the electrical circuit 1802, which is comprised in the front side 1801, and the rear side 1802. The alternative improved substrate 1800 may also further comprise an alteration stop layer 1807 adjacent to the electrically insulating and disposed between the electrically insulating layer 1806 and the exposed zone 1803 on the rear side 1802.

The alternative improved substrate 1800 comprises an electrochemical treatment cell 1808 in the exposed zone 1804 on the rear side 1803 of the substrate 1800. The electrochemical treatment cell 1808 comprises a set of cavities in the form of trenches 1809 disposed around the electrode 1805 on the rear side 1802 of the alternative improved substrate 1800. The trenches 1809 may be formed by, for example, a technique referred to as deep reactive-ion etching (DRIE). Another technique to form the trenches 1809 may involve micro-machining and engraving by means of a laser.

In this embodiment, the rear side 1802 of the alternative improved substrate 1800 comprises a sacrificial dielectric layer 1810. The sacrificial dielectric layer 1810 may comprise, for example, silicon nitride. Seen from the rear side 1803, the sacrificial dielectric layer 1810 is covered by a metal layer 1811 of which the electrode 1804 forms part. In order to form the trenches 1809, openings may initially be created in the metal layer 1811 and in the sacrificial dielectric layer 1810 by means of conventional photolithographic techniques and by means of conventional etching techniques, such as, for example, humid etching and plasma etching.

In an electrochemical treatment, the alternative improved substrate 1800 may be coupled to an electrochemical treatment device, which may be similar to any of the electrochemical treatment devices presented hereinbefore. The electrochemical treatment device may thus comprise a container containing a chemically reactive substance and an electrode arrangement within the chemically reactive substance. A voltage may then be applied between the electrode arrangement and the electrode 1805 of the electrochemical treatment cell 1808.

The chemically reactive substance may enter the trenches 1809. The voltage that is applied will cause a lateral flow of electrical current between the trenches 1809 and the electrode 1805 of the electrochemical treatment cell 1808. Once the electrochemical treatment has been carried out, the sacrificial dielectric layer 1810 and the metal layer 1811 may be removed.

The alternative improved substrate 1800 may comprise a plurality of electrochemical treatment cells similar to the electrochemical treatment cell 1808 described hereinbefore with reference to FIGS. 18 and 19. The electrochemical treatment cells may be arranged so as to form a honeycomb-like structure.

Figure 20:
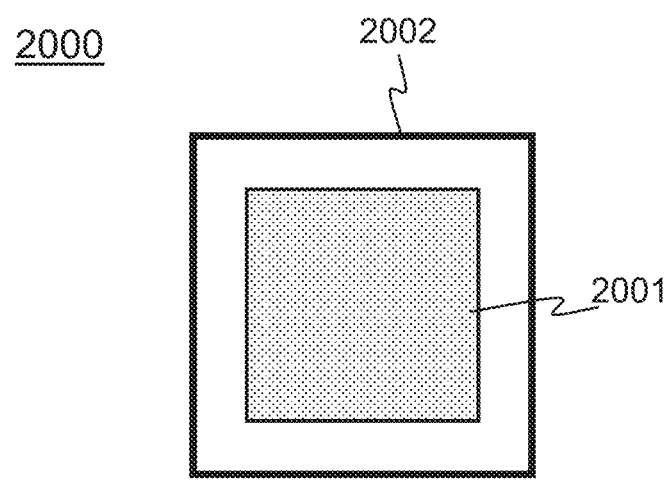
FIG. 20 is a schematic diagram of an integrated circuit device that comprises a substrate that has undergone an electrochemical treatment.

FIG. 20 schematically illustrates an integrated circuit device 2000 comprising a substrate 2001 that has undergone an electrochemical treatment. FIG. 20 provides a schematic diagram of the integrated circuit device 2000. The substrate 2001 in the integrated circuit device 2000 may be, for example, any one of the substrates described hereinbefore to which an exemplary method described hereinbefore has been applied. The substrate 2001 may be housed in a package 2002 that protects the substrate 2001. The package 2002 may comprise respective external electrical contacts, which may electrically be coupled to respective contact pads of the substrate 2001. The contact pads may be located on the front side of the substrate 2001 like the electrical circuit comprised therein.

The embodiments described hereinbefore with reference to the drawings are presented by way of illustration. The invention may be implemented in numerous different ways. In order to illustrate this, some alternatives are briefly indicated.

The invention may be applied in numerous types of products or methods that involve altering a substrate by electrochemical treatment. In the presented embodiments, a substrate is altered by forming pores in the substrate. In other embodiments, a different type of alteration may be achieved, such as, for example, locally removing substrate material. Furthermore, in the presented embodiments, a semiconductor substrate is mentioned. In other embodiments, a different type of substrate may be altered by electrochemical treatment.

The term "substrate" should be understood in a broad sense. This term may embrace any entity that may form a support for an electrical circuit. A substrate may be a monolithic entity, but may also be an assembly of various entities, such as, for example, the substrate assembly 1700 illustrated in FIG. 17. The term "electrical circuit" should be understood in a broad sense. This term may embrace any entity having a function that involves an electrical quantity, such as, for example, a micro electro-mechanical system (MEMS), a transmission line, an electrical connection. Moreover, in an embodiment of the invention, the electrical circuit may at least partially be comprised in the substrate rather than being entirely located on or in a front side of the substrate.

There are various different ways of laterally applying an electrical potential to an exposed zone on a rear side of a substrate. In the presented embodiments, the rear side of the substrate comprises an electrode. In other embodiments, an electrode on the rear side of the substrate may not be required because, for example, electrodes of opposite polarity within a chemically reactive substance are used.

A substrate that comprises an alteration stop layer does not necessarily require an electrochemical treatment as described hereinbefore, in which an electrical potential is applied laterally, causing a lateral flow of electrical current. In principle, a substrate that comprises an alteration stop layer may undergo a conventional electrochemical treatment in which an electrical potential is applied transversally, causing a transversal flow of electrical current. What matters is that an alteration stop layer is disposed in a substrate between a front side that comprises an electrical circuit and a rear side that is at least partially in contact with a chemically reactive substance. For example, the improved substrate 1300 illustrated in FIG. 13 may be modified as follows to allow such a conventional electrochemical treatment. At least one electrical contact is provided between the front side 1301 and the bulk section 1309 of the improved substrate 1300.

In general, there are numerous different ways of implementing the invention, whereby different implementations may have different topologies. In any given topology, a single entity may carry out several functions, or several entities may jointly carry out a single function. In this respect, the drawings are very diagrammatic.

The remarks made hereinbefore demonstrate that the embodiments described with reference to the drawings illustrate the invention, rather than limit the invention. The invention can be implemented in numerous alternative ways that are within the scope of the appended claims. All changes that come within the meaning and range of equivalency of the claims are to be embraced within their scope. Any reference sign in a claim should not be construed as limiting the claim. The verb "comprise" in a claim does not exclude the presence of other elements or other steps than those listed in the claim. The same applies to similar verbs such as "include" and "contain". The mention of an element in singular in a claim pertaining to a product, does not exclude that the product may comprise a plurality of such elements. Likewise, the mention of a step in singular in a claim pertaining to a method does not exclude that the method may comprise a plurality of such steps. The mere fact that respective dependent claims define respective additional features, does not exclude combinations of additional features other than those reflected in the claims.

The invention claimed is:

1. A method of processing a substrate having a front side comprising an electrical circuit and a rear side comprising an exposed zone that faces the electrical circuit, the method comprising:

electrochemically treating the substrate by laterally applying an electrical potential at least to the exposed zone on the rear side of the substrate, while the exposed zone is in contact with a chemically reactive substance, the electrical potential causing an electrical current that flows laterally in the exposed zone and passes through the chemically reactive substance, so that the electrical current and the chemically reactive substance alter the substrate starting from the exposed zone on the rear side inwardly toward the front side.

2. The method of processing a substrate according to claim 1, wherein the electrical potential is laterally applied at least to the exposed zone on the rear side of the substrate by means of:

an electrode arrangement disposed on the rear side of the substrate; and an electrode arrangement within the chemically reactive substance that faces the exposed zone on the rear side of the substrate.

3. The method of processing a substrate according to claim 2, wherein the electrode arrangement within the chemically reactive substance has a shape that causes the electrical potential to be applied to the exposed zone in a non-homogenous fashion.

4. The method of processing a substrate according to claim 2, wherein the electrode arrangement within the chemically reactive substance has a shape that changes at least one time during the electrochemically treating.

5. The method of processing a substrate according to claim 2, wherein the electrode arrangement within the chemically reactive substance comprises an array of electrodes, whereby, during the electrochemically treating, at least a part of respective voltages applied to respective electrodes in the array of electrodes changes at least one time during the electrochemically treating.

6. The method of processing a substrate according to claim 2, wherein the exposed zone on the rear side of the substrate comprises at least one electrochemical treatment cell, an electrochemical treatment cell comprising a set of cavities disposed around an electrode that forms part of the electrode arrangement on the rear side of the substrate, wherein, during the electrochemically treating, the chemically reactive substance enters the set of cavities.

7. The method of processing a substrate according to claim 1, wherein, during the electrochemically treating, the electrical potential is laterally applied to the exposed zone in a non-homogenous fashion in at least one of the following dimensions: space and time, so as to define at least one of the following characteristics: a volume within the substrate where the substrate is altered, a varying degree of alteration throughout the volume, and a varying form of alteration throughout the volume.

8. The method of processing a substrate according to claim 1, wherein the substrate comprises, at least in the exposed zone, a material that, when in contact with the chemically reactive substance while an electrical current flows through the material, alters depending on radiation applied to the material, wherein, during the electrochemically treating, radiation is non-homogenously applied to the exposed zone.

9. The method of processing a substrate according to claim 1, wherein the substrate comprises an alteration stop layer at least disposed between the electrical circuit at the front side and the exposed zone on the rear side, the alteration stop layer comprising a material that is relatively resistant to the chemically reactive substance.

10. The method of processing a substrate according to claim 9, wherein the alteration stop layer comprises a semiconductor material.

11. The method of processing a substrate according to claim 1, wherein the substrate comprises an electrically insulating layer disposed between the electrical circuit at the front side and the rear side.

12. The method of processing a substrate according to claim 11, wherein the electrically insulating layer is disposed between the electrical circuit at the front side and alteration stop layer.

13. The method of processing a substrate according to claim 1, wherein the lateral flow of current and the chemically reactive substance cause pores to be formed in the substrate inwardly from at least the exposed zone.

14. An integrated circuit device that includes a substrate having a front side comprising an electrical circuit and a rear side in which a zone faces the electrical circuit, whereby the substrate has been altered by applying a method in accordance with claim 1 at least in a volume comprised between the electrical circuit and the zone in the rear side that faces the electrical circuit.

15. The integrated circuit device according to claim 14, wherein the volume comprises pores.

* * * * *